(12) United States Patent
Landes et al.

(10) Patent No.: US 8,917,097 B2
(45) Date of Patent: Dec. 23, 2014

(54) METHOD AND SYSTEM FOR DETECTING AND LOCATING BY REFLECTOMETRY ELECTRICAL FAULTS IN METAL STRUCTURES

(75) Inventors: Olivier Landes, Saint Jean (FR); Christophe Lochot, Leguevin (FR)

(73) Assignee: Airbus Operations (S.A.S.), Toulouse Cedex (FR)

( * ) Notice: Subject to any disclaimer, the term of this patent is extended or adjusted under 35 U.S.C. 154(b) by 360 days.

(21) Appl. No.: 13/408,350

(22) Filed: Feb. 29, 2012

(65) Prior Publication Data
US 2012/0223720 A1 Sep. 6, 2012

(30) Foreign Application Priority Data
Mar. 2, 2011 (FR) ...................... 11 51677

(51) Int. Cl.
*G01R 31/11* (2006.01)
*G01R 31/00* (2006.01)
*B64F 5/00* (2006.01)

(52) U.S. Cl.
CPC ............ *G01R 31/008* (2013.01); *B64F 5/0045* (2013.01); *G01R 31/11* (2013.01)
USPC .......................................... 324/533; 324/534

(58) Field of Classification Search
CPC .... G01R 31/11; G01R 31/086; G01R 31/021; G01R 31/008; G01R 31/281; G01R 31/00; G01R 31/024; G01R 31/3171; G01R 31/31855; G01R 31/318572; G01R 31/31937; G01R 27/16; G01R 31/04; G01R 31/046; G01R 31/1272; H04L 1/24
See application file for complete search history.

(56) References Cited

U.S. PATENT DOCUMENTS

| | | | | |
|---|---|---|---|---|
| 4,739,276 A * | 4/1988 | Graube | .......................... | 324/534 |
| 5,376,889 A * | 12/1994 | Milroy | .......................... | 324/644 |
| 6,909,977 B2 * | 6/2005 | Orton | .............................. | 702/65 |
| 7,215,126 B2 * | 5/2007 | Furse et al. | .................... | 324/534 |
| 7,276,914 B2 * | 10/2007 | Li | ..................................... | 324/534 |
| 7,495,450 B2 * | 2/2009 | Furse et al. | .................... | 324/519 |
| 8,508,248 B1 * | 8/2013 | Chengson | ................ | 324/763.01 |
| 2004/0100272 A1 | 5/2004 | Styles | | |
| 2009/0147695 A1 * | 6/2009 | Barkan et al. | .................. | 370/252 |

FOREIGN PATENT DOCUMENTS

| | | |
|---|---|---|
| DE | 19650974 | 6/1998 |
| GB | 2463890 | 3/2010 |

OTHER PUBLICATIONS

French Patent Office, French Search Report FR 1151677 (2 pgs), Written Opinion (4 pgs), Oct. 19, 2011.

* cited by examiner

*Primary Examiner* — Vinh Nguyen
(74) *Attorney, Agent, or Firm* — Wood, Herron & Evans, LLP

(57) ABSTRACT

A method for detecting and locating by reflectometry electrical faults in a metal structure includes injecting a probe signal into an electrical propagation line held at a substantially constant distance from the structure. The propagation line is connected at one end to the metal structure and at another end to a signal generator. The method further includes detecting a reflected signal in return from the injected signal. In addition, the method includes comparing the reflected signal with a reference signature of an undisrupted reflected signal.

12 Claims, 4 Drawing Sheets

METHOD AND SYSTEM FOR DETECTING AND LOCATING BY REFLECTOMETRY ELECTRICAL FAULTS IN METAL STRUCTURES

TECHNICAL FIELD

The invention relates to a method and a system for detecting and locating, by reflectometry, electrical faults in metal structures, in particular for the detection of inaccessible electrical anomalies, such as current flow faults or losses in an electrical conductor.

A conventional anomaly is the return-current fault which in general is difficult to locate in electrical installations. Thus, in new aeroplanes with composite skins, such as carbon-fibre reinforced plastic materials (CFRPs), the skin can no longer perform the return-current function between the passengers and power sources, nor the electromagnetic protection, which functions were provided beforehand by the metal skin of the aeroplane.

PRIOR ART

To address this, networks of metal structures are proposed. These structures incorporate primary metal parts which generally receive several electrical cables. In particular, these parts form "U"-shaped or "I"-shaped metal structures to produce raceways for cables along the fuselage or along the cargo hold ceiling of an aeroplane.

FIG. 1 illustrates the presence of these raceways 1 (U-shaped) and 2 (I-shaped) in a composite-skin aeroplane architecture 3: these raceways appear, respectively, in the roof of the fuselage 4 and under the intermediate floor 5 for access to the bottom of the cargo hold 6. The raceways are formed by elements interconnected by metal braids and are used both as electromagnetic protection screens and supports for very long electrical cable routes.

However above all, these raceways will concentrate the return of currents carried by the cables, by forming low-impedance current lines with the cables that they contain. Under these conditions, it appears essential to be able to detect the loss of a braid or the degradation of its electrical functions over the whole life-cycle of the aeroplane.

Specifically, the cable lengths represent several hundreds of kilometres in modern aeroplanes and reliable safety diagnostics of the electrical network is an important, even vital, issue.

This detection cannot be carried out globally by means of an ohmmeter since, because the raceways are connected to the network at many points, the loss or degradation of a braid does not have a significant effect on the value of the total resistance of the network. An individual check of the braids is not realistic in an economic sense in view of their large number and their poor accessibility.

Moreover, reflectometry is a known diagnostic method based on the principle of radar to characterize a given medium by the propagation of a signal and analysis of the signal reflected through this medium. Specifically, a part of the energy of the signal, which propagates according to the propagation law of the medium in question, is reflected towards the point of injection of the signal when it encounters a discontinuity. A reflectometry device includes a test signal generator, a detector of reflected signals and an analyzer of these reflected signals, configured to evaluate a characteristic of the medium.

This method provides for, in particular, detecting anomalies in electrical cables, as described for example in the patent document U.S. Pat. No. 7,495,450. Reflectometry signals change in the frequency domain (FDR) or in the time domain (TDR) according to the nature of the signal injected: FDR uses a wobbulated sinusoidal signal (frequency-modulated signal) and TDR a modulated pulsed signal. This technique exhibits the advantage of needing only one point of access to the cable.

However, reflectometry does not provide for discriminating between signals reflected by circuit breaks or short-circuits and line impedance fluctuations that are also detected.

SUMMARY OF THE INVENTION

The invention aims to allow the application of this technology to the detection and locating of electrical faults in metal cable-support structures such as raceways, while providing for discriminating between reflected signals and impedance fluctuations. To this end, the invention proposes using a particular electrical propagation coupled to each raceway.

More specifically, an object of the invention is a method for detecting and locating electrical faults by reflectometry in metal cable-support raceway-type structures, in which an electrical propagation line is held at a substantially constant distance from each structure, the line being connected at one of the ends to the metal structure. At its other end, a probe signal is injected into the line and a reflected signal, in return from the injected signal, is detected and analyzed by comparison with a reference signature of an undisrupted reflected signal.

According to particular modes, the method operates in the frequency domain (FDR) or in the time domain (TDR) with a probe signal that is frequency-modulated or pulse-modulated respectively.

The invention relates also to a system for detecting and locating by reflectometry electrical faults in metal structures, able to implement the above-defined method. Such a system includes at least one insulated electrical conductor, held at a substantially constant distance from one of the walls of the said metal structure to be tested. The conductor is connected, at one of its ends, to means of transmission and injection of a probe signal and to means of connection to a device for detecting and analyzing a reflected signal and is in contact, at the other end, with the said metal structure.

According to particular embodiments:
- the insulated conductor is fastened at intervals to the said metal structure;
- the fastening means are fitted to supports secured to a wall of the metal structure.
- the said electrical contact includes a terminal fastened to the said structure and crimped onto the end of the conducting element;
- the device for detecting and analyzing the reflected signal also includes the means for transmitting the probe signal;
- the means of injection and of connection form a single connector.

BRIEF DESCRIPTION OF THE DRAWINGS

Other aspects and particular features of the implementation of the invention will become clear upon reading the detailed description that follows, accompanied by appended drawings which represent, respectively.

DETAILED DESCRIPTION

Figure 1:
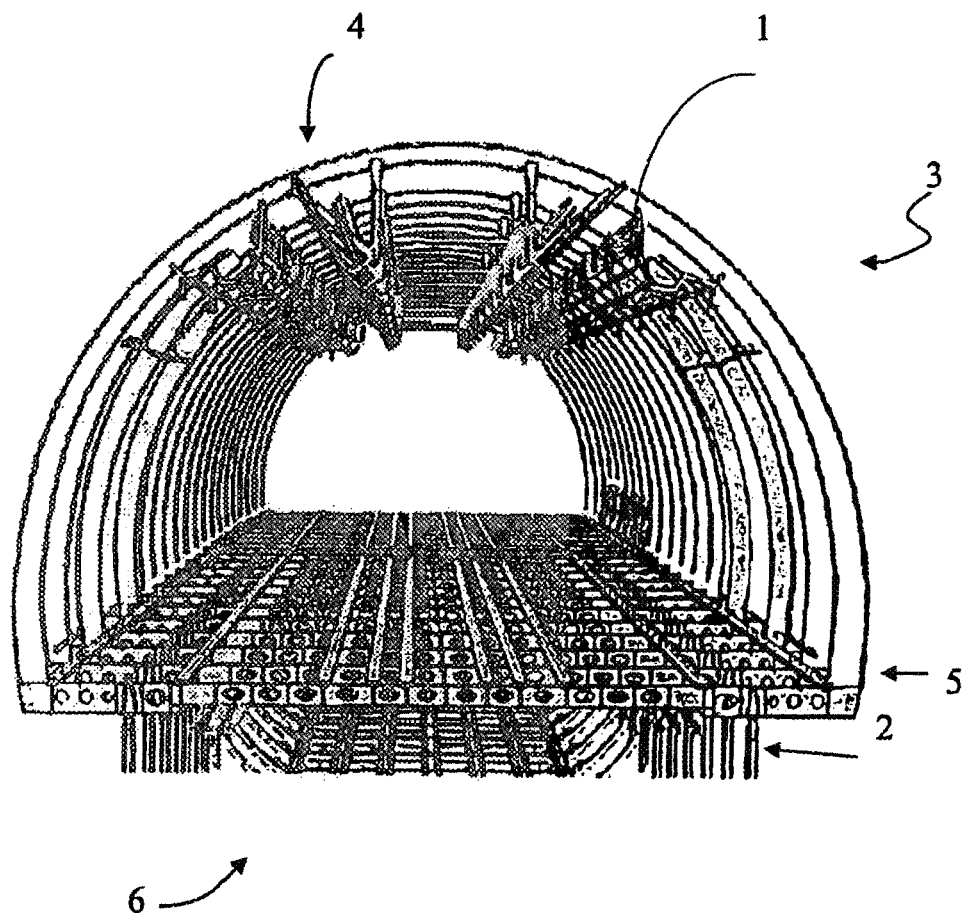
in FIG. 1, the arrangement of raceways in a composite-skin aeroplane architecture (already commented on)

Identical references used in the drawings refer to identical or equivalent items.

Figure 2:
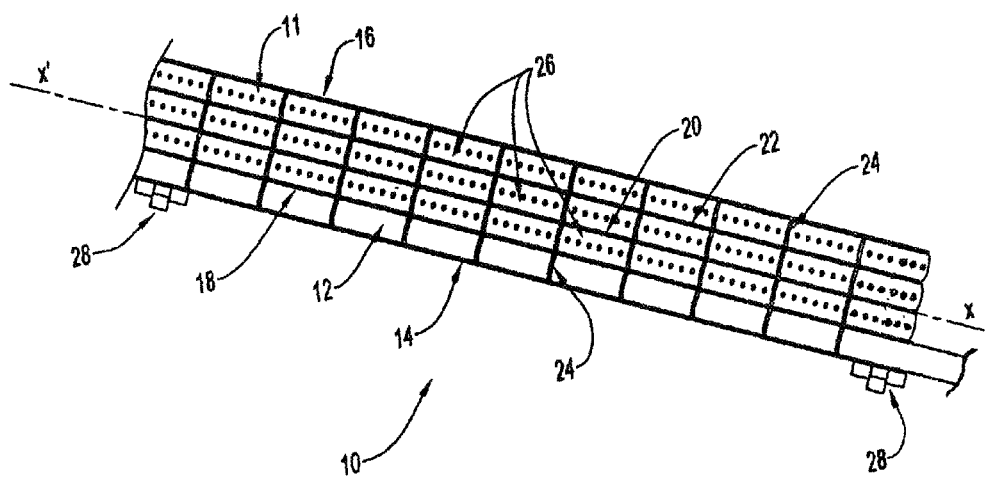
in FIGS. 2, a view from the front of an elementary metal raceway structure.

As illustrated in FIG. 2, an elementary metal structure 10 provides for receiving four electrical cables, such as the cable 12. The elementary structure 10 is about two meters long and is made up of outer longitudinal walls 14 and 16 and inner longitudinal walls 18, 20 and 22, parallel with the axis X'X of the structure 10. A longitudinal support made of plastic material 11 is wedged into the structure to receive the cables 12 on a receiving face exhibiting a curvature able to house the electrical cable. Fasteners 24 are arranged regularly along each cable housing 26 defined between two walls. Fixing means 28 are also provided to secure the elementary structure 10 to a frame if necessary.

Figure 3:
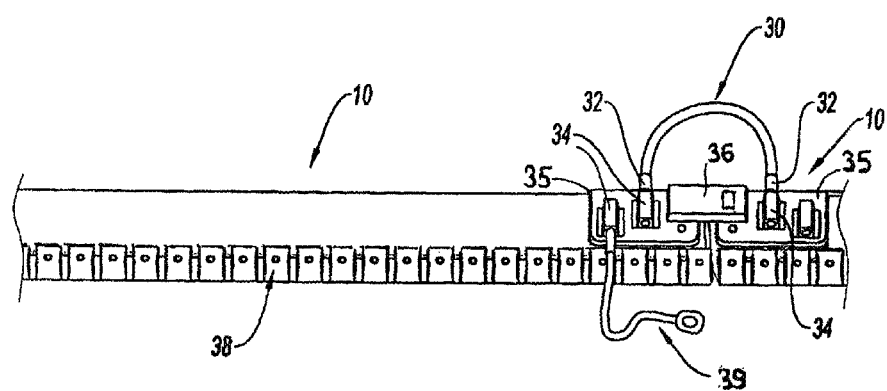
in FIG. 3, a view of the rear of two interconnected elementary structures.

FIG. 3 shows the interconnection between two of these elementary structures 10 at the back of these structures, a set of elementary structures thus interconnected forming a raceway.

The electrical interconnection is achieved by the braids of a flexible insulated connecting cable 30. This cable includes metal plugs 32 at its ends into which the ends of the braids are crimped, the plugs being introduced in a tight-fitting manner into female connectors 34 fixed to a support 35 at the back of the structures 10.

The mechanical interconnection between two structures 10 is achieved by a connecting bar 36 fixed to each structure 10, one of the fixing means being removable. A strip of electrical contactors 38 is also provided, as well as other connecting cables 39 introduced into connectors 34 for the return current of local electrical devices, or to serve as connection terminals in an example embodiment of the invention as explained below.

Figure 4:
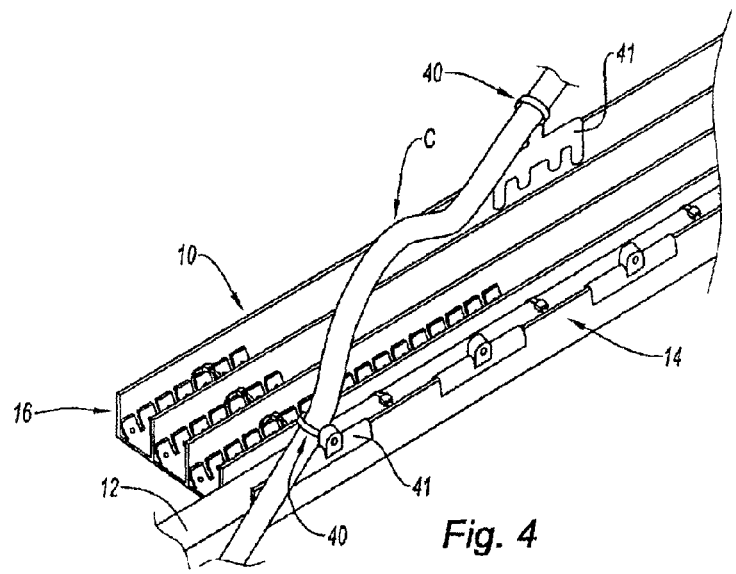
in FIG. 4, a perspective view of an example contact between an elementary metal structure and an electrical conductor according to the invention.

FIG. 4 illustrates an example contact arrangement between an elementary metal structure 10, supporting a cable 12, and an insulated electrical conductor C according to the invention. The insulated conductor C is held at a distance from the structure 10 by passing through fasteners in the form of clamps 40, which are advantageously resilient, fitted to supports 41 secured to walls 14 and 16 of the metal structure 10. The conductor C is, in this example, a single sheathed 22-gauge copper wire. The conducting wire C is connected at one of its ends to the connector 500 (cf. FIG. 5) and at the other end to a connection terminal 39 (cf. FIG. 3).

Figure 5:
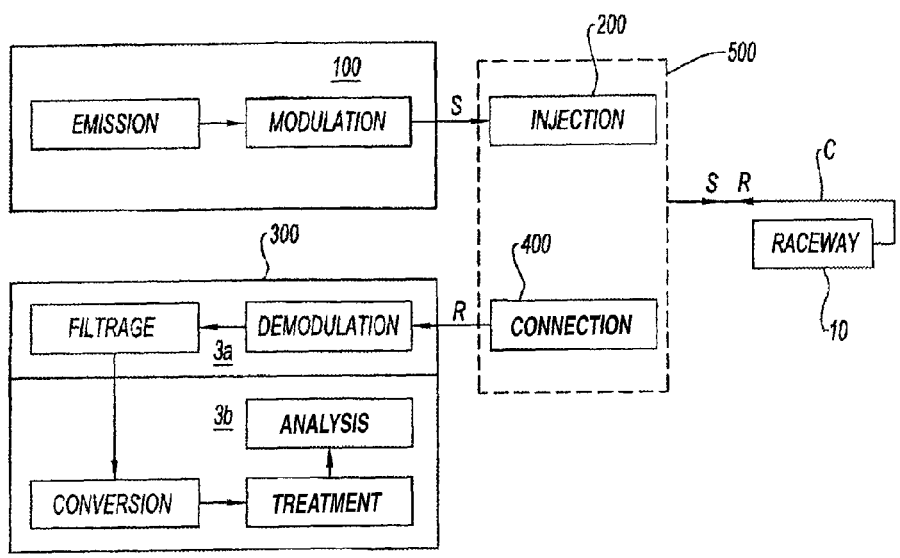
in FIG. 5, a diagram of the main signal processing steps by reflectometry.

The main signal processing steps by reflectometry, as applied to the raceways for the detection of electrical anomalies through the return current, are illustrated by the diagram of FIG. 5. In this drawing, a probe signal S is transmitted and modulated in a signal generator 100, the modulation being able to be frequency modulation or pulse modulation depending on the modulator used. This signal S is injected to a first end of the insulated conducting element C by injection means 200.

The conductor C is arranged at a distance along a raceway-type metal structure 10 and connected at its end to this raceway, according to arrangements such as those described above. A reflected signal R coming from the conductor C is transmitted to a signal detection and analysis device 300 via connection means 400. A line of propagation of the signal is thus created by the presence of conductors C associated with the ground plane formed by the raceways.

The injection and connection means can advantageously be grouped together into a single connector, and the generator and detection and analysis device into a single item of equipment 300.

The reflected signal R is demodulated and filtered in a detection part 3a of the device 300, then converted into digital data, which data is processed to form a chronogram in a data processing part 3b of the device 300. The analysis of this data is carried out by comparing this chronogram with that of the signature of the raceway previously recorded in a memory.

Figure 6:
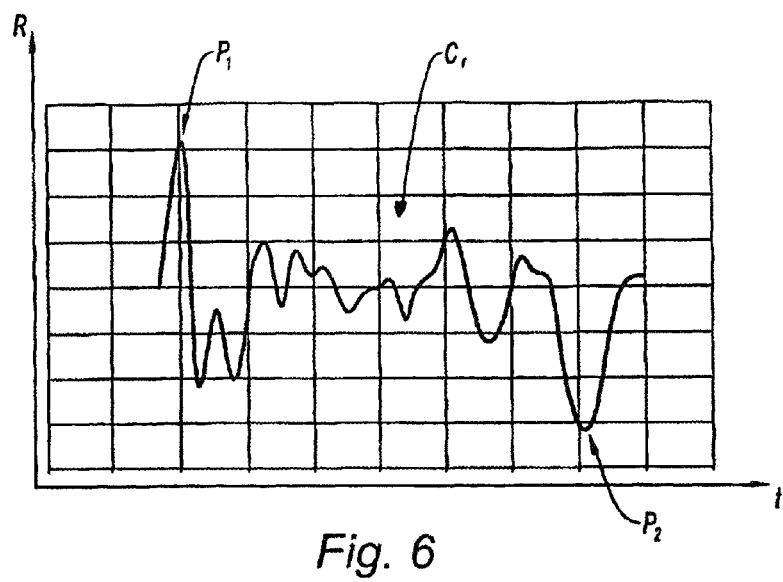
in FIG. 6, a diagram of the intensity of a reflected probe signal as a function of time of a reference signature.

A chronogram Cr of variations of intensity of the reflected signal R as a function of time "t" is schematically reproduced in the diagram of FIG. 6.

On this diagram obtained from an analysis oscilloscope, with appropriate arbitrary units, the first "positive" peak P1 of the reflected signal "R" appears, having a substantially greater intensity than those of the other positive peaks: P1 corresponds to the signal injected at the start of the line. The last "negative" peak P2 (i.e. in the opposite direction) corresponds to the signal reflected by the short-circuit at the end of the line. The intermediate peaks which appear between the end peaks P1 and P2 are due to impedance fluctuations in the propagation line. The chronogram obtained is the reference signature of the raceway.

Figure 7:
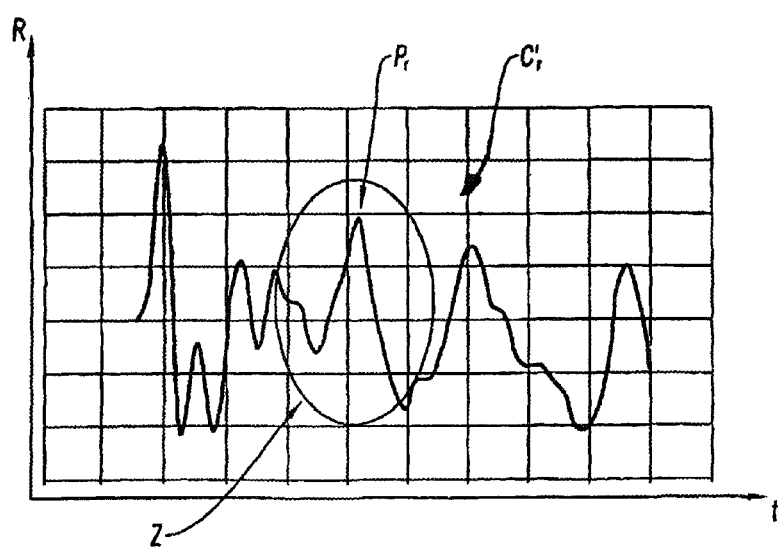
in FIG. 7, a diagram of the intensity of a reflected probe signal as a function of time highlighting a current-fault in a raceway.

A faulty connection in the raceway, for example due to a disconnection or a bad connection of a braid, generates a break in impedance. As illustrated by the chronogram C'r of FIG. 7, the probe signal will be reflected on this break. This reflection results in a disrupted area Z on the diagram, in comparison with the reference diagram, and the formation of a reflection peak Pr in this area.

Such changes in the spectrum are detected and faults thus located during maintenance tests, by a comparison between the measurement carried out and the reference signature recorded beforehand on delivery.

The invention is not limited to the example embodiments described and represented. It is for example possible to fix the electrical conductors C at a distance along the metal structures by any appropriate means: bonding, clipping, hooks, guide rail, conducting tracks of a flexible printed circuit ("flex rigid" type), etc. Furthermore, clamps for holding the cables in the metal structures can also be used by the electrical conductor C in the absence of the cable for which these clamps are intended.

The invention claimed is:

1. A method for detecting and locating electrical faults by reflectometry in a metal structure, the metal structure having electrical current traveling therethrough, the method comprising:

connecting an electrical propagation line in the form of an insulated electrical conductor to the metal structure at a first end of the conductor and to a signal generator at an opposite second end of the conductor, with the electrical propagation line being held at a substantially constant distance from the metal structure along a length between the first and second ends;

injecting a probe signal, by the signal generator, into the electrical propagation line held at a substantially constant distance from the metal structure;

detecting a reflected signal in return from the injected signal; and comparing the reflected signal with a reference signature of an undisrupted reflected signal to determine if any electrical faults are in the metal structure while filtering out portions of the reflected signal that result from impedance fluctuations caused from current present in the metal structure.

2. The method according to claim 1, wherein the probe signal comprises a frequency-modulated signal or a pulse-modulated signal in order to operate in the frequency domain or in the time domain, respectively.

3. The method according to claim 1, wherein the metal structure comprises a plurality of metal elementary structures arranged to form a plurality of raceways for electrical cables in an airplane with a composite skin.

4. The method of claim 3, wherein two of the plurality of metal elementary structures are electrically coupled by at least one cable and the first end of the conductor is coupled to the at least one cable, wherein a disconnection or a bad connection of the at least one cable causes the reflected signal to signify electrical faults in the two of the plurality of metal elementary structures electrically coupled by the at least one cable.

5. A system for detecting and locating by reflectometry electrical faults in a metal structure, the metal structure having electrical current traveling therethrough, the system comprising:

an electrical propagation line in the form of at least one insulated electrical conductor having a first end connected to the metal structure and an opposite second end, the conductor being held at a substantially constant distance from a wall of the metal structure along a length between the first and second ends;

a signal generator connected to the second end of the conductor, the signal generator generating a probe signal that is injected into the conductor; and a signal detection and analysis device connected to the another end of the conductor, the signal detection and analysis device detecting a reflected signal in return from the injected signal and comparing the reflected signal with a reference signature of an undisrupted reflected signal to determine if any electrical faults are in the metal structure while filtering out portions of the reflected signal that result from impedance fluctuations caused from current present in the metal structure.

6. The system according to claim 5, wherein the conductor is fastened to the metal structure by fasteners fitted to supports secured to a wall of the metal structure.

7. The system according to claim 5, wherein the conductor is fastened to the metal structure by clamps intended to hold at least one cable so that the clamps fasten both the conductor and the at least one cable to the metal structure.

8. The system according to claim 5, wherein the end of the conductor being connected to the metal structure is connected to the metal structure by a connection terminal fastened to the structure and crimped onto the end of the insulated conductor.

9. The system according to claim 5, wherein the signal detection and analysis device and the signal generator are included in a single item of equipment.

10. The system according to claim 5, wherein the signal detection and analysis device and the signal generator are connected to the conductor by a single connector.

11. The system according to claim 5, wherein the metal structure comprises a plurality of metal elementary structures arranged to form a plurality of raceways for electrical cables in an airplane with a composite skin.

12. The method of claim 11, wherein two of the plurality of metal elementary structures are electrically coupled by at least one cable and the first end of the conductor is coupled to the at least one cable, wherein a disconnection or a bad connection of the at least one cable causes the reflected signal signify electrical faults in the two of the plurality of metal elementary structures electrically coupled by the at least one cable.

* * * * *